United States Patent [19]
Bowers et al.

[11] Patent Number: 6,015,980
[45] Date of Patent: Jan. 18, 2000

[54] METAL LAYERED SEMICONDUCTOR LASER

[75] Inventors: John E. Bowers; Daniel Abraham Tauber, both of Santa Barbara, Calif.

[73] Assignee: The Regents of the University of California, Oakland, Calif.

[21] Appl. No.: 08/828,372

[22] Filed: Mar. 28, 1997

Related U.S. Application Data

[63] Continuation-in-part of application No. 08/612,687, Mar. 8, 1996.

[51] Int. Cl.[7] ...................................................... H01L 33/00
[52] U.S. Cl. ............................ 257/99; 257/744; 257/745; 257/751; 257/763; 257/765; 257/766
[58] Field of Search ................................ 257/79, 99, 751, 257/743, 744, 745, 763, 765, 766

[56] References Cited

U.S. PATENT DOCUMENTS

| | | | |
|---|---|---|---|
| 4,891,329 | 1/1990 | Reisman et al. | 438/459 |
| 4,948,748 | 8/1990 | Kitahara et al. | 438/405 |
| 5,207,864 | 5/1993 | Bhat et al. | 156/633 |
| 5,286,671 | 2/1994 | Kurtz et al. | 438/456 |
| 5,346,848 | 9/1994 | Grupen-Shemansky et al. | 438/406 |
| 5,390,210 | 2/1995 | Fouquet et al. | 372/92 |
| 5,393,711 | 2/1995 | Biallas et al. | 438/458 |
| 5,407,856 | 4/1995 | Quenzer et al. | 148/DIG. 12 |
| 5,413,951 | 5/1995 | Ohori et al. | 438/479 |
| 5,416,044 | 5/1995 | Chino et al. | 438/455 |
| 5,513,204 | 4/1996 | Jayaraman | 372/96 |

FOREIGN PATENT DOCUMENTS

| | | |
|---|---|---|
| 417838 | 2/1991 | European Pat. Off. . |
| 63-79312 | 4/1988 | Japan . |
| 5-198529 | 8/1993 | Japan . |

OTHER PUBLICATIONS

Dubravko Ivan Babic, *Double-fused long-wavelength vertical-cavity lasers*, Ph.D. Dissertation, ECE Technical Report #95–20, Aug. 1995, University of California at Santa Barbara, California 93106.

*Primary Examiner*—Minh Loan Tran
*Attorney, Agent, or Firm*—Gates & Cooper

[57] ABSTRACT

By using fusion of a heat spreader layer, a large bandwidth, high power semiconductor laser can be fabricated. The use of multiple metals with low thermal resistance allows for higher power because heat flow is conducted away from the active region easily. The extraction of heat from the active region makes the resultant laser more stable with the capability for higher power outputs.

15 Claims, 10 Drawing Sheets

METAL LAYERED SEMICONDUCTOR LASER

CROSS-REFERENCE TO RELATED APPLICATION

This application is a continuation-in-part of U.S. patent application Ser. No. 08/612,687, filed Mar. 8, 1996, and entitled "Buried Layer In A Semiconductor Formed By Bonding," by Dubravko I. Babic and John E. Bowers, and is incorporated by reference herein.

STATEMENT AS TO RIGHTS TO INVENTIONS MADE UNDER FEDERALLY SPONSORED RESEARCH AND DEVELOPMENT

This invention was made with Government support under Contract No. F19628-93-K-0023, awarded by the Air Force. The Government has certain rights in this invention.

BACKGROUND OF THE INVENTION

1. Field of the Invention

A large bandwidth, high power semiconductor chip laser is a useful electronic device for telecommunications. This invention relates in general to an apparatus and method for making a semiconductor device. More particularly, the invention relates to a process for making a fused large bandwidth, high power capability semiconductor laser.

2. Description of Related Art

Current conventional semiconductor lasers have a maximum bandwidth of 43 GHz. These devices used strained Indium Gallium Arsenide (InGaAs) quantum wells and emitted light at a wavelength of approximately 1 $\mu$m. The highest bandwidth for a semiconductor laser emitting light at 1.55 $\mu$m, a wavelength suitable for long-distance optical fiber communications, is approximately 25 GHz. The best high power narrow stripe semiconductor lasers emit approximately 300 milliwatts of power, in the 1 $\mu$m, 1.3 $\mu$m, and 1.5 $\mu$m wavelength range.

However, the power output and bandwidth of present semiconductor lasers is rapidly becoming insufficient for telecommunication systems demands. The limitations of present devices will require more optical fibers to meet the expected demands of telecommunication service customers.

The poor microwave transmission line characteristics of current semiconductor laser structures can degrade high frequency performance, because there is no high electrical conductivity ground plane for the microwaves in the current structure. The lack of a high electrical conductivity ground plane significantly limits the bandwidth of current devices.

SUMMARY OF THE INVENTION

To minimize the limitations in the prior art described above, and to minimize other limitations that will be come apparent upon reading and understanding the present specification, the present invention discloses a powerful and highly productive method and apparatus for making a semiconductor laser.

By using fusion of a heat sink layer that keeps the active layer of the device cool, the present invention allows for larger power outputs of the finished device. Further, with the heat sink the device has lower thermal resistance and provides less microwave loss for the device, making the bandwidth of the device made using the present invention larger.

The microstrip metal-fused semiconductor laser of the present invention is an in-plane semiconductor laser structure with a thick (1 micrometer ($\mu$m)) gold layer below the lower cladding of the epitaxial material. The structure is fabricated by evaporating 5000 angstroms (Å) of gold onto epitaxial laser material and also onto an independent substrate. The two wafers are then fused together under conditions of elevated temperature and pressure using the gold layers as the fusing medium. Following this step, the substrate on which the epitaxial layers were originally grown is removed by wet chemical etching (stopping at a stop etch layer) and the remaining film is processed into a high speed ridge waveguide structure. The structure has specific advantages for both high speed and high power operation.

The resultant structure is a semiconductor laser which is capable of superior high speed and high power operation relative to conventional semiconductor laser devices.

BRIEF DESCRIPTION OF THE DRAWINGS

Referring now to the drawings in which like numbers represent similar features throughout:

FIGS. 1A–1O are figures of the steps used to make the device of the present invention;

DETAILED DESCRIPTION OF THE INVENTION

Overview

The microstrip metal-fused semiconductor laser of the present invention is fabricated using two wafers which are eventually fused together. The fusion layers of the wafers are gold, each being approximately 5000 angstroms thick, which results in a one micron thick gold layer underneath the lower contact and cladding layers of the laser.

In the preferred embodiment, there is a sequence of three metallizations of each wafer prior to the fusing step. The actual metallization sequence on the wafers prior to fusing is Chromium (Cr), Platinum (Pt), and Gold (Au). The Cr and Pt layers are necessary for surface adhesion and as a Au diffusion barrier respectively.

The first layer above the metal layers is a p-contact layer, which supports a p-cladding layer. The p-cladding layer is in contact with the active layer of the device, which is a separate confinement heterostructure (SCH) and quantum well active region.

Ridges, consisting of the n-cladding and a highly n-doped contact layer, sit above the SCH, and are buried in a polyimide structure. The ridge is metallized with an n-contact, and a secondary metallization, typically of a mixture of Cr and Au, is evaporated on top of the ridge and on the polyimide for purposes of electrically bonding or probing the device.

A broad ridge is also etched around the SCH, active region, p-cladding, and p contact layer, down to the metal fused layer. On top of this ridge a Cr/Au metallization layer is evaporated for purposes of bonding and probing.

The structure has specific advantages for both high speed and high power operation relative to conventional structures. These advantages include improved microwave performance. Because the thick gold layer is an excellent microwave ground plane, the transmission line bandwidth limit is significantly abated in this structure.

The thick gold layer is also an excellent thermal conductor which is close (less than 2 $\mu$m away) to the active region of the device where heat is generated. This layer is an efficient heat spreader and should thus allow for higher power operation than would be possible in conventional structures. The high power capability also is necessary for high speed performance and this characteristic therefore contributes to improved bandwidths.

Devices made using the present invention use an n-doped material in the ridge structure. This results in ridges that have lower resistance than current semiconductor laser structures, which uses p-doped ridges. P-doped ridges are used in conventional structures because it is difficult to grow high quality laser material on p-substrates, where the p-layers are grown before the n-layers.

The carrier mobility in p-doped material (where the carriers are holes) is significantly smaller than the electron mobility of n-doped material. Thus, p-doped ridges have higher resistance than n-doped ridges. In the present invention, the p-doped material makes a large area bottom contact to the gold layer, thus reducing the resistance of the overall device. This reduction in resistance improves high speed operation because the resistive-capacitive (RC) rolloff frequency will be higher.

The low resistance also contributes to high power operation because ohmic heating is minimized.

Detailed Drawings

Figure 1A:
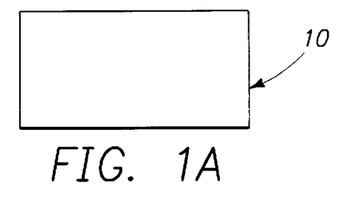

FIGS. 1A–1O are figures of the steps used to make the device of the present invention.

FIG. 1A shows substrate 10. Substrate 10 is typically indium phosphide, but can also be gallium arsenide, silicon, or other materials.

Figure 1B:
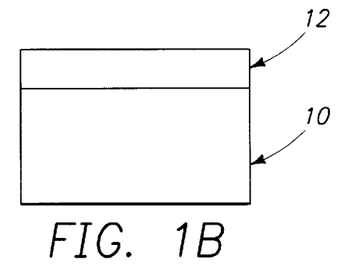

FIG. 1B shows first metal layer 12 deposited on substrate 10. First metal layer 12 is typically chromium, but can be other materials, such as platinum, titanium, aluminum, nickel, tantalum, molybdenum, zinc, tin, and gold. First metal layer 12 is typically evaporated, but can also be sputtered or otherwise attached to substrate 10.

Figure 1C:
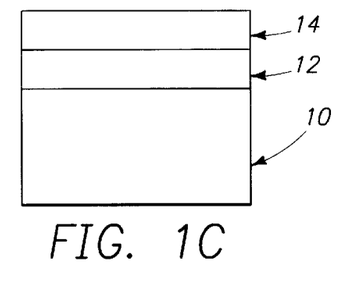

FIG. 1C shows second metal layer 14 coupled to first metal layer 12. Second metal layer 14 is typically platinum, but can be other materials. Second metal layer 14 is typically evaporated, but can also be sputtered or otherwise attached to first metal layer 12. First metal layer 12 and second metal layer 14 are used for surface adhesion and diffusion barriers for layers that will be attached to second metal layer 14.

Figure 1D:
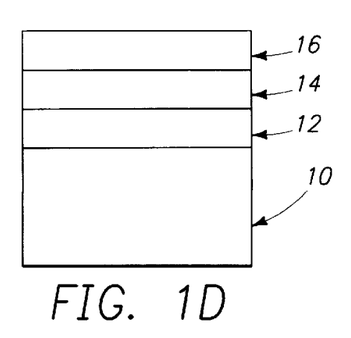

FIG. 1D shows fusing layer 16 coupled to second metal layer 14. Fusing layer 16 is typically gold, but can be other metal materials.

Figure 1E:
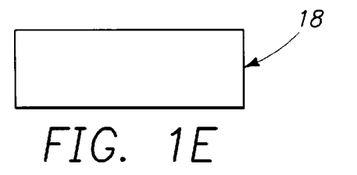

FIG. 1E shows second substrate 18. Second substrate 18 is typically indium phosphide, but can also be gallium arsenide or other materials.

Figure 1F:
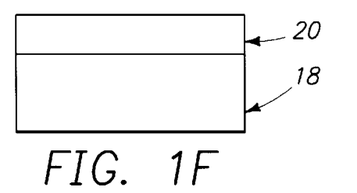

FIG. 1F shows contact layer 20 grown on second substrate 18. Contact layer 20 is typically a highly doped n-contact layer, but can also be a highly doped p-contact layer. Contact layer 20 is typically 1000 angstroms thick, but can be thicker or thinner as desired. Contact layer 20 is typically indium gallium arsenide (InGaAs), but can be other materials such as gallium arsenide or any other material that can be grown on a crystalline semiconductor and can be used as a contact layer to that semiconductor. Contact layer 20 may also have a semiconductor composition that varies along the vertical direction, making contact layer 20 a graded layer. The contact layer 20 is necessary for low electrical resistance contact to the second substrate 18.

Figure 1G:
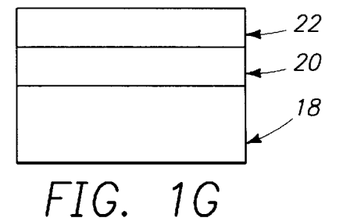

FIG. 1G shows cladding layer 22 attached to contact layer 20. Cladding layer 22 is typically moderately n-doped indium phosphide, but can be moderately p-doped, and can also be other materials, such as AlGaAs, or any other material that can be grown on a crystalline semiconductor and used as a cladding layer for a laser structure. The dopant type used for cladding layer 22 must match that of contact layer 20, e.g., if contact layer 20 is p-doped, then cladding layer 22 must also be p-doped.

Figure 1H:
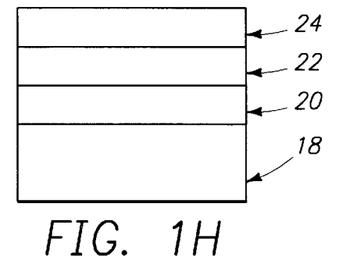

FIG. 1H shows epitaxial layer 24 grown on cladding layer 22. Epitaxial layer 24 consists of both a separate confinement heterostructure (SCH), and a quantum well active region. The quantum well active region can be a single or multiple quantum well structure. Epitaxial layer 24 is typically indium gallium arsenide phosphide (InGaAsP), but can be other materials such as InGaAs or GaAs.

Figure 1I:
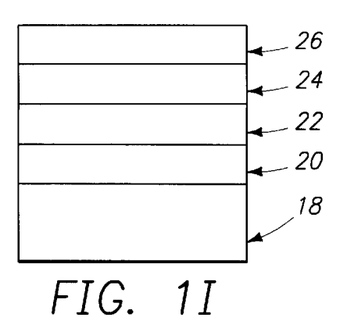

FIG. 1I shows cladding layer 26 attached to epitaxial layer 24. Cladding layer 26 is typically a moderately p-doped InP layer, but can be other materials or doped with n-type dopants. Cladding layer 26 must be of an opposite dopant type than cladding layer 22, e.g., if cladding layer 22 is p-doped, then cladding layer 26 must be n-doped.

Figure 1J:
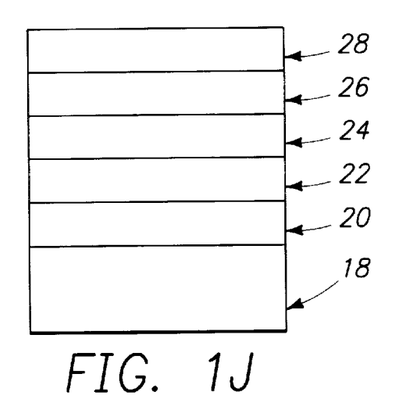

FIG. 1J shows contact layer 28 attached to cladding layer 26. Contact layer 28 is typically a highly doped p-contact layer, but can be other materials or a highly n-doped layer. Contact layer 28 is typically approximately 1000 angstroms thick, but can be thicker or thinner as desired. Contact layer 28 is typically InGaAs, but can be other materials. Contact layer 28 may also have a semiconductor composition that varies along the vertical direction, making contact layer 28 a graded layer. The contact layer 28 is necessary for low electrical resistance contact to the semiconductor. Contact layer 28 must be the same dopant type as cladding layer 26, e.g., if cladding layer 26 is p-doped, then contact layer 28 must also be p-doped.

Figure 1K:
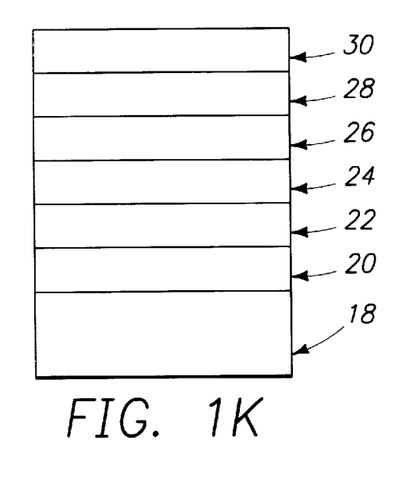

FIG. 1K shows first metal layer 30 attached to contact layer 28. First metal layer is typically chromium, but can be other materials. First metal layer 30 is typically evaporated, but can also be sputtered or otherwise attached to contact layer 28.

Figure 1L:
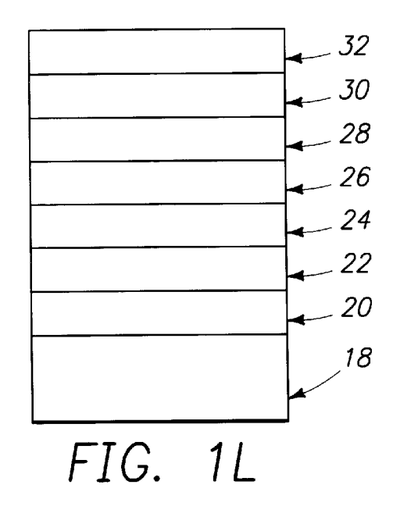

FIG. 1L shows second metal layer 32 coupled to first metal layer 30. Second metal layer 32 is typically platinum, but can be other materials. Second metal layer 32 is typically evaporated, but can also be sputtered or otherwise attached to first metal layer 30. First metal layer 30 and second metal layer 32 are used for surface adhesion and diffusion barriers for layers that will be attached to second metal layer 32.

Figure 1M:
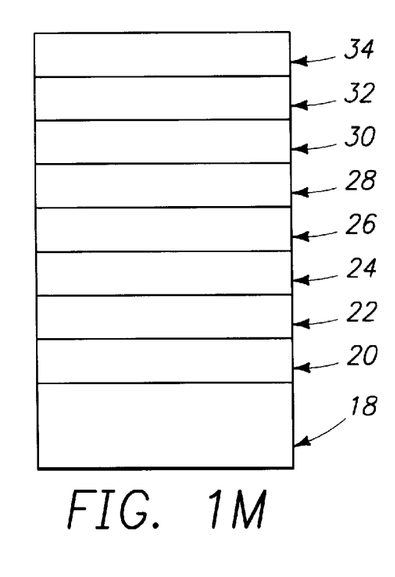

FIG. 1M shows fusing layer 34 coupled to second metal layer 32. Fusing layer 34 is typically gold, but can be other metal materials.

Figure 1N:
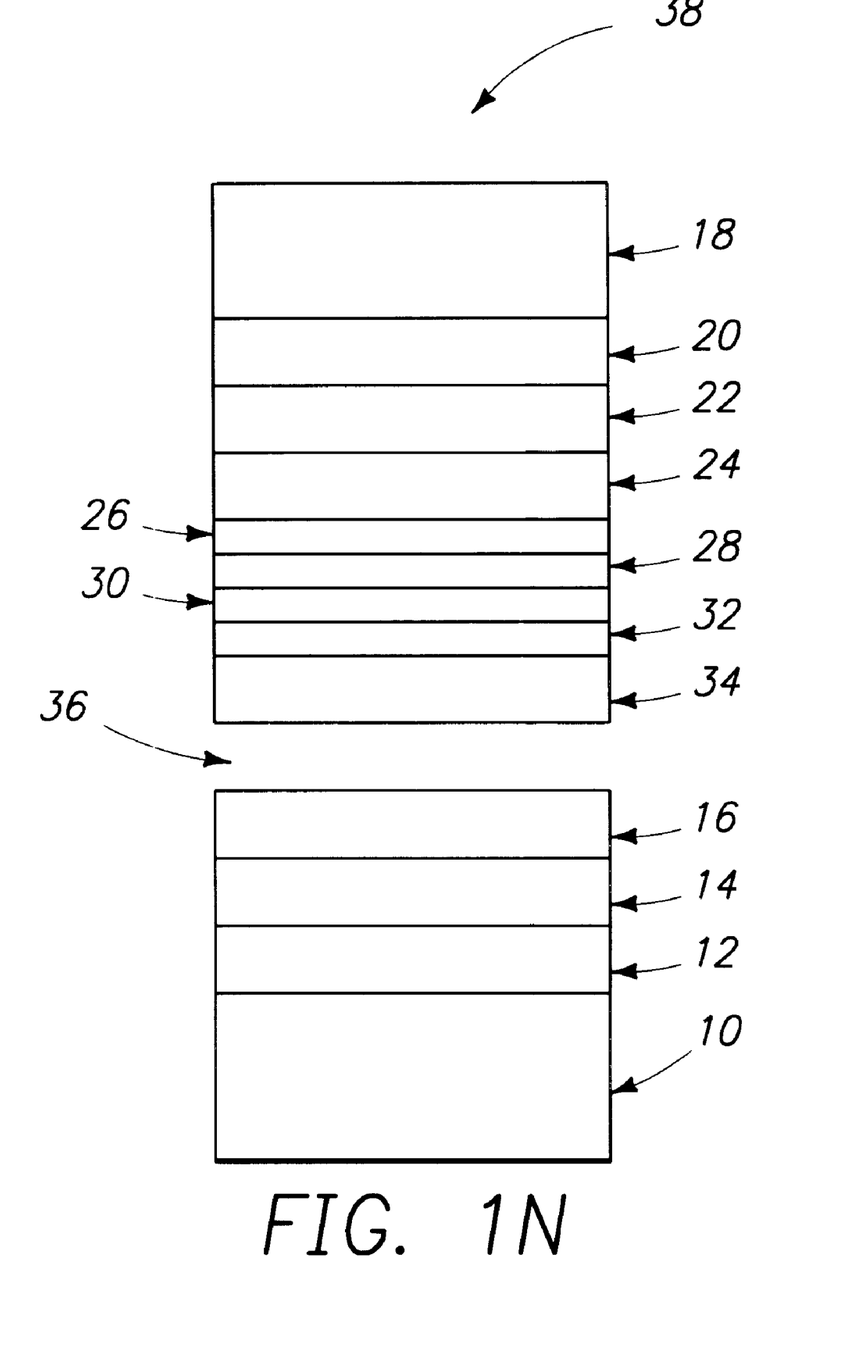

FIG. 1N shows fusing layer 34 and fusing layer 16 in close contact. Fusion area 36 shows where the fusing layer 34 and the fusing layer 16 will be joined together. Once fusing layer 16 and fusing layer 34 are placed in close contact, the assembly is placed in an oven at approximately 300 degrees centigrade for approximately four hours to fuse the two pieces into one assembly 38. Once the fusion has taken place, the first metal layer 12, second metal layer 14, fusion layer 16, fusion layer 34, first bonding layer 32, and second bonding layer 30 become the metal fusion layer.

FIG. 1O shows the assembly 36 after second substrate 18 has been removed. Second substrate is typically removed by etching, but can be removed by other means.

FIGS. 2A–2E are diagrams that show the formation of the structure of a device made using the present invention.

Figure 2A:
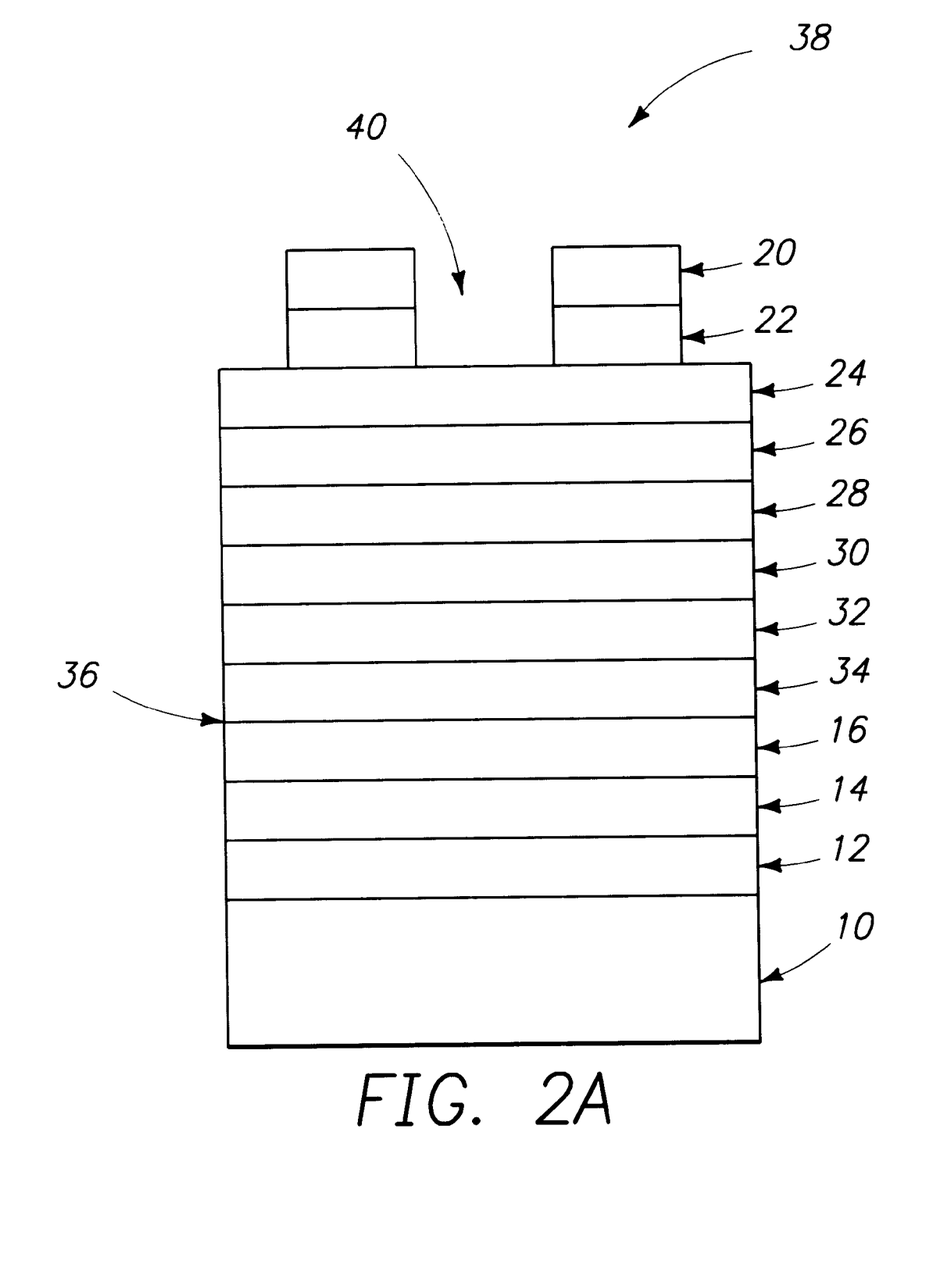
FIGS. 2A–2E are diagrams that show the formation of the structure of a device made using the present invention.

FIG. 2A shows etch process 40 etching away n-contact layer 20 and n-cladding layer 22. Etch process 40 is typically a combination of photoresist masking and curing, followed by an etch with an acid. Etch process 40 may also require multiple etches with acids or different kinds of etchants, such as reactive ion etching (RIE) or dry etching, to etch through both n-contact layer 20 and n-cladding layer 22.

Figure 2B:
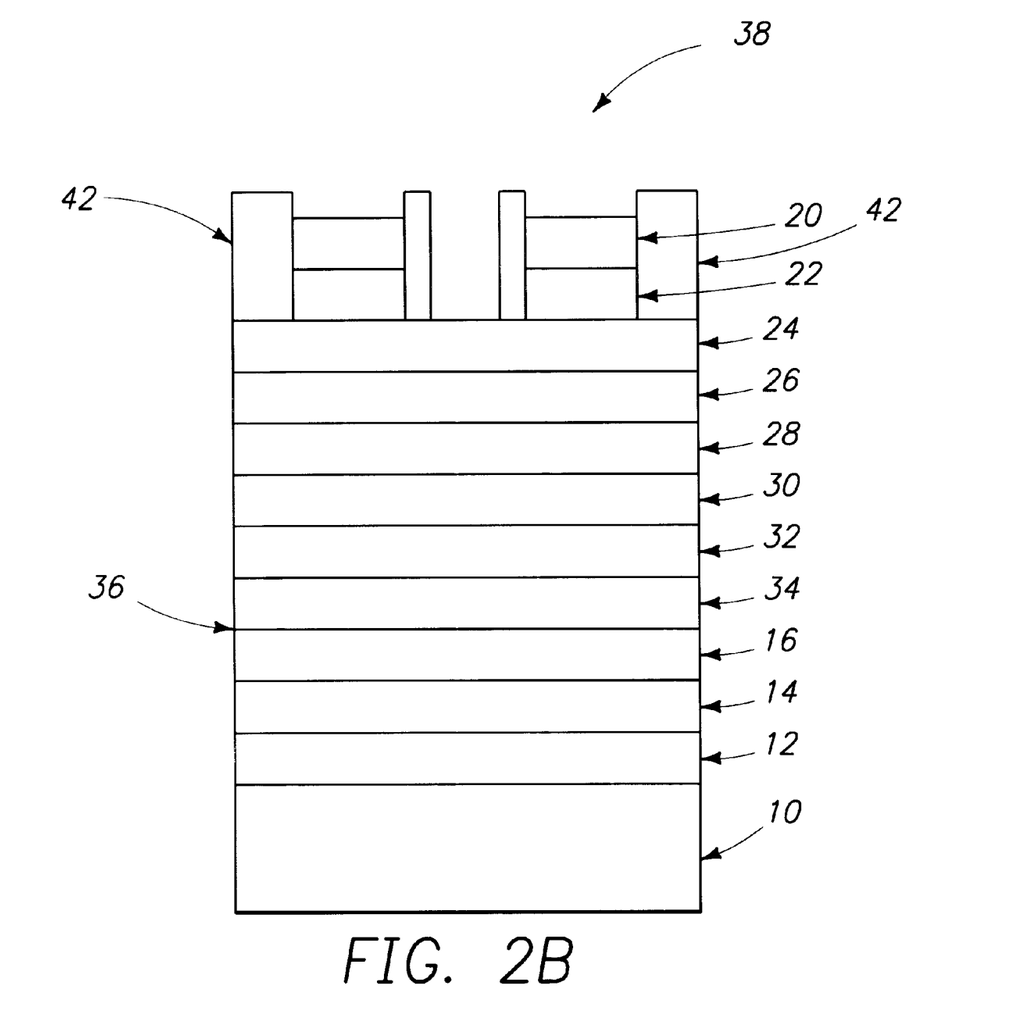

FIG. 2B shows assembly 38 with masking layer 42 coupled to n-contact layer 20, n-cladding layer 22, and epitaxial layer 24. Masking layer 42 is typically polyimide, but can be other materials such as photoresist or dielectric materials. Masking layer 42 is typically spun onto assembly 34, and then cured. Masking layer 42 is then patterned with photoresist and etched away using an oxygen plasma until the n-contact layer 20 is exposed.

Figure 2C:
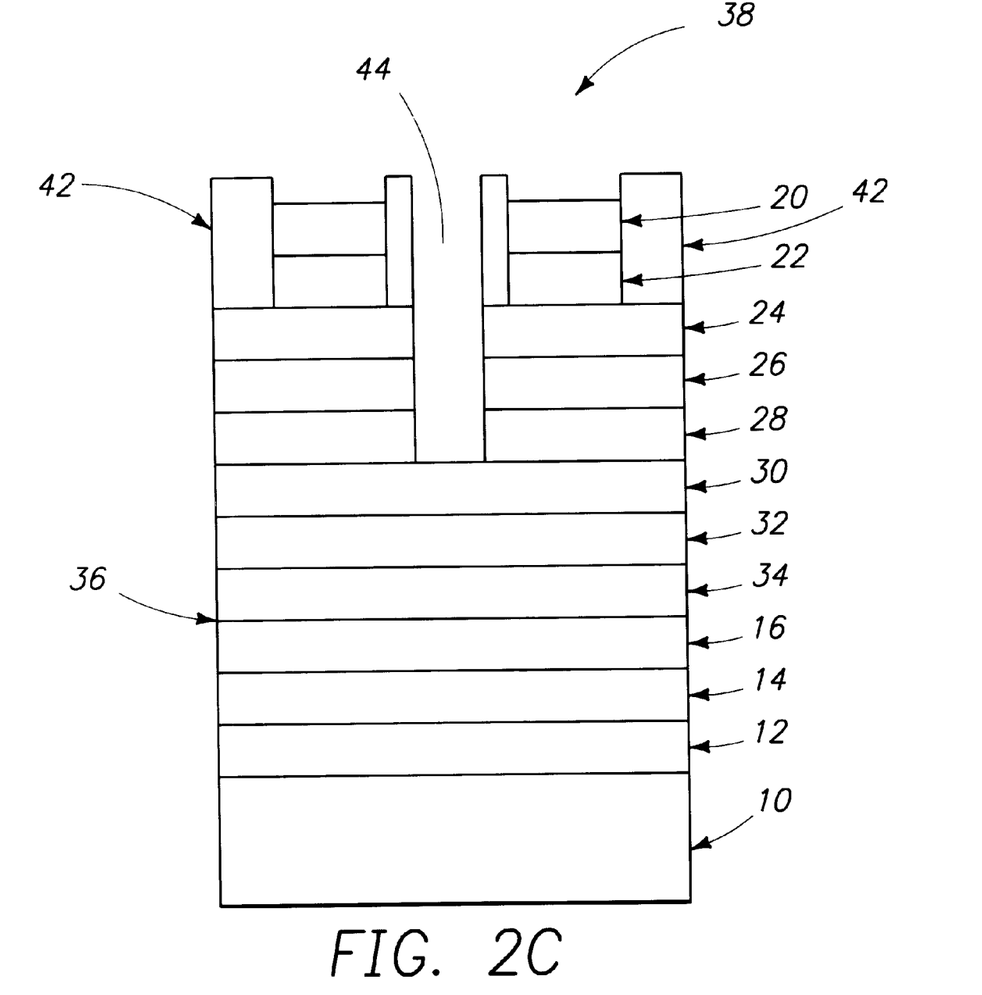

FIG. 2C shows etch process 44 etching through epitaxial layer 24, cladding layer 26 and contact layer 28 to first metal layer 30. Etch process 44 can be a single etch process, or a series of etch processes. Masking layer 42 can be used as a mask to etch epitaxial layer 24, cladding layer 26, and contact layer 28 as shown, but other masks can be used to selectively etch epitaxial layer 24, cladding layer 26, and contact layer 28 to different geometrical patterns than used in masking layer 42.

Figure 2D:
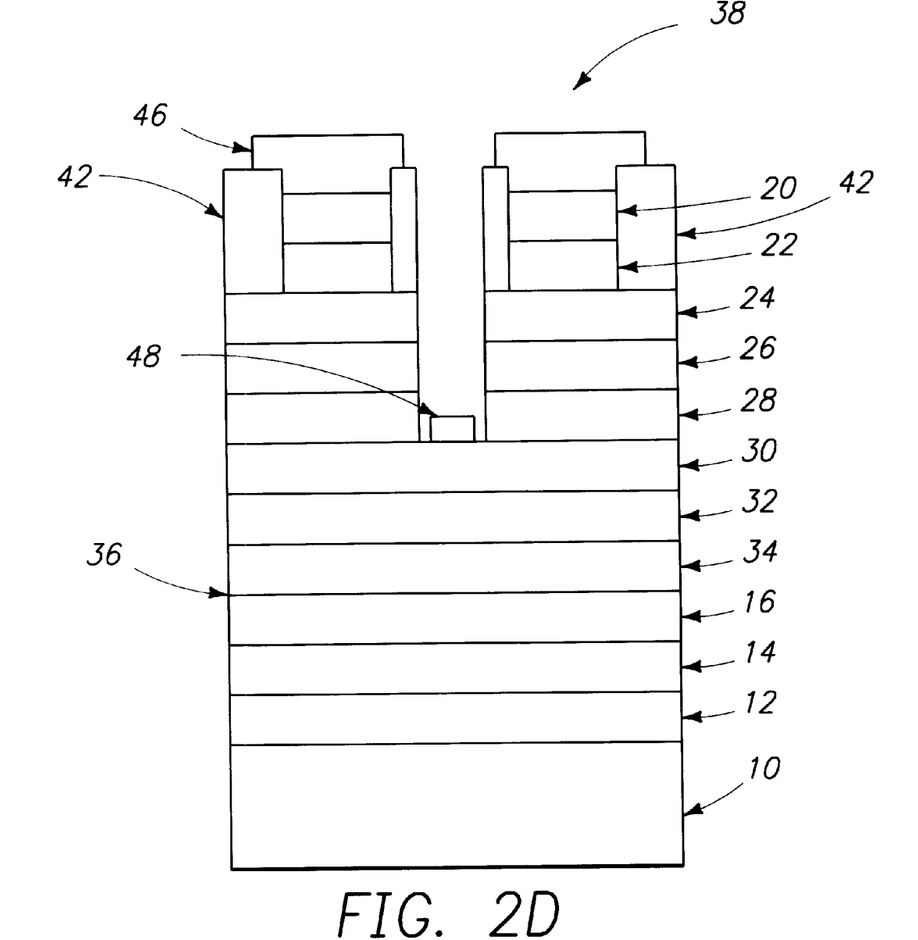

FIG. 2D shows assembly 38 with metallization areas 46 and 48 coupled to assembly 38. Metallization area 46 is used for bonding external wires to the assembly 38, as metallization layer 46 is coupled to n-contact layer 20. Metallization area 48 is typically used for probing the assembly 38.

Figure 2E:
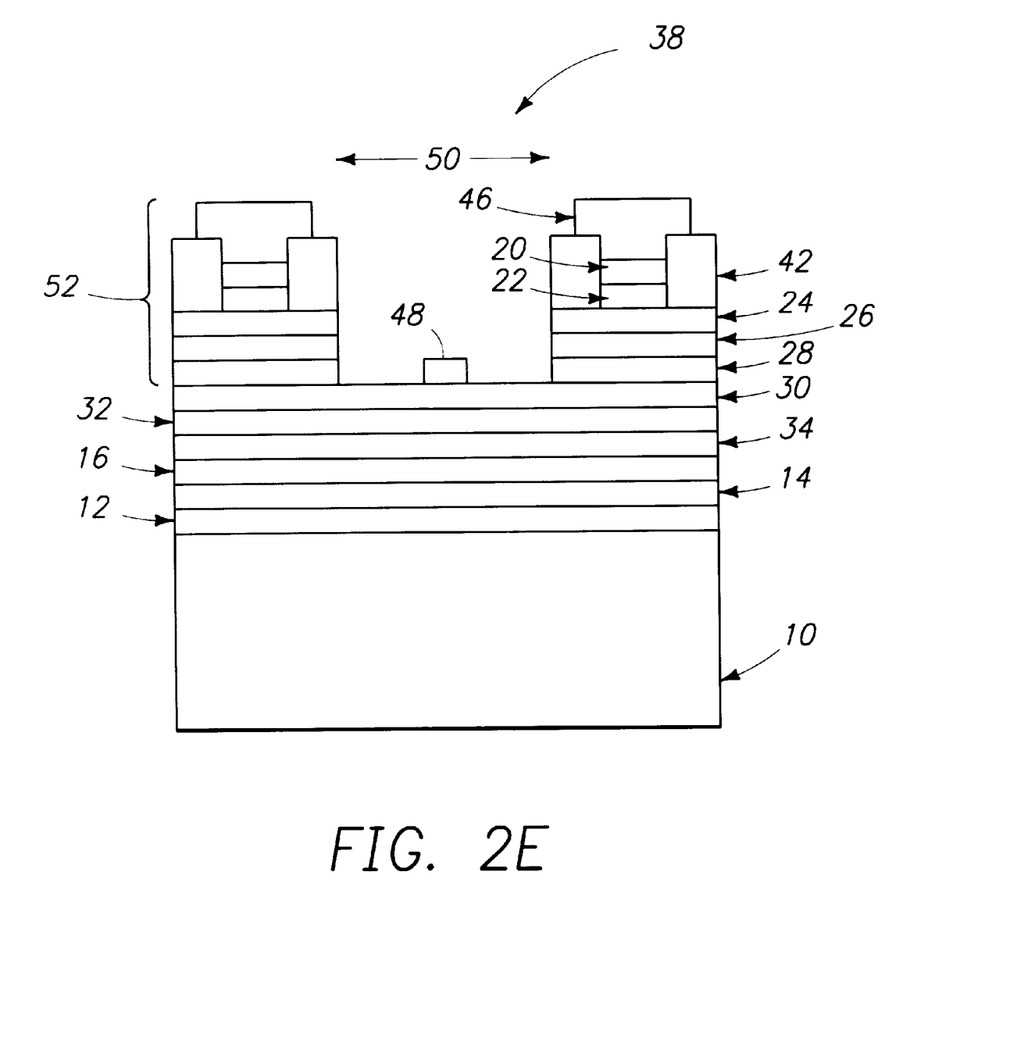

FIG. 2E shows assembly 38 in final form. Metallization area 46 is typically smaller than the area defined by masking layer 42, and the space 50 is shown larger in FIG. 2E than in FIG. 2D. Structure 52 represents the laser structure of the assembly 38. Structure 52 can take other forms, such as a vertical cavity laser (VCL), or other forms, such as optical modulators, waveguide photodetectors, directional couplers, and optical switches.

Figure 3:
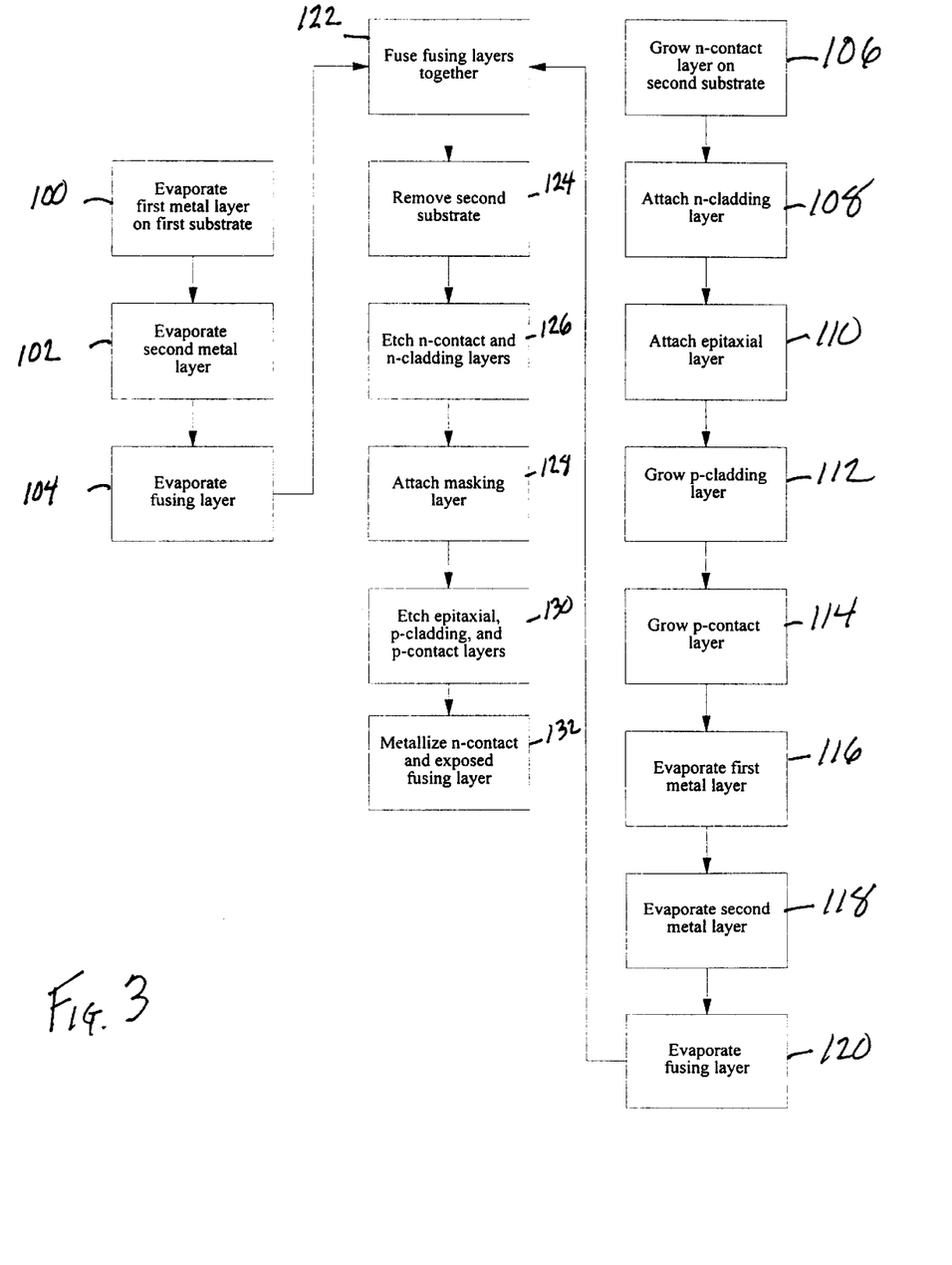
FIG. 3 is a flow chart showing the steps used in the present invention.

FIG. 3 is a flow chart showing the steps used in the present invention.

Block 100 represents the step of evaporating a first metal layer on the first substrate. The first metal layer is typically chromium, but can be other metal or non-metallic materials. The first metal layer may be evaporated, sputtered, or otherwise attached to the first substrate.

Block 102 represents the step of evaporating a second metal layer on the first metal layer. The second metal layer is typically platinum, but can be other metal or non-metallic materials. The second metal layer may be evaporated, sputtered, or otherwise attached to the first metal layer.

Block 104 represents the step of evaporating a fusing layer on the second metal layer. The fusing layer is typically gold, but can be other materials. The fusing layer may be evaporated, sputtered, or otherwise attached to the second metal layer.

Block 106 represents growing an n-contact layer on a second substrate. The n-contact layer is typically InGaAs, but can be other materials, or can be a graded layer. The second substrate is typically InP, but can be other materials.

Block 108 represents growing an n-cladding layer on the n-contact layer. The n-cladding layer is typically InP, but can be other materials.

Block 110 represents growing an epitaxial layer to form the active region on the n-cladding layer. The epitaxial layer is typically indium gallium arsenide phosphide, but can be other materials.

Block 112 represents attaching a p-cladding layer to the epitaxial layer. The p-cladding layer is typically InP, but can be other materials. The p-cladding layer is typically grown, but can be attached by other means.

Block 114 represents growing a p-contact layer on the p-cladding layer. The p-contact layer is typically InGaAs, but can be other materials.

Block 116 represents the step of evaporating a first metal layer on the p-contact layer. The first metal layer is typically chromium, but can be other metal materials. The first metal layer may be evaporated, sputtered, or otherwise attached to the epitaxial layer.

Block 118 represents the step of evaporating a second metal layer on the first metal layer. The second metal layer is typically platinum, but can be other metal materials. The second metal layer may be evaporated, sputtered, or otherwise attached to the first metal layer.

Block 120 represents the step of evaporating a fusing layer on the second metal layer. The fusing layer is typically gold, but can be other materials. The fusing layer may be evaporated, sputtered, or otherwise attached to the second metal layer.

Block 122 represents fusing the fusing layer on the first substrate and the fusing layer on the second substrate together. The fusion is accomplished by placing the two fusing layers in close contact, and then placing the two wafers in an oven at 300 degrees centigrade for four hours. The temperature of the oven is ramped up at 1 degree centigrade per minute, stays at 300 degrees for four hours, and then is ramped back to room temperature at one degree centigrade per minute.

Block 124 represents removing the second substrate from the fused assembly. The second substrate is removed using wet or dry etch processes. The removal of the second substrate can be aided by using a stop etch layer between the substrate and the epitaxial layer.

Block 126 represents etching the n-contact and n-cladding layers. The etch process may be more than one actual etch. The etch process may also use the n-contact layer as a mask to etch the n-cladding layer. There are masked regions of the wafer where the n-contact layer and the n-cladding layer are not etched away.

Block 128 represents attaching a masking layer to the n-contact, n-cladding, and exposed epitaxial layers. The masking layer is typically polyimide, but can be other materials. The masking layer is typically patterned, but patterning is not required.

Block 130 represents etching the epitaxial, p-cladding, and p-contact layers. The etch process may be more than one actual etch, using wet, dry, or a combination of wet and dry etch processes. The etch may use the masking layer as a mask for the etch, but this is not required.

Block 132 represents metallizing the n-contact and exposed fusing layer. The metallization is typically a mixture of chromium and gold, but can be other materials.

General Considerations

The use of metal fusion provides a method for manufacturing semiconductor lasers that is currently unavailable. The use of metal fusion will allow for high power, high bandwidth lasers for telecommunications and other applications.

In the description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The description of the preferred embodiment is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A semiconductor laser, comprising:

a substrate;

a fusion layer coupled to the substrate; and a laser structure, coupled to the fusion layer, wherein the laser structure comprises:

a first contact layer coupled to the fusion layer;
a first cladding layer coupled to the first contact layer;
an active layer coupled to the first cladding layer;
a second cladding layer coupled to the active layer;
a second contact layer coupled to the second cladding layer;
a metallization layer selectively coupled to the second contact layer and the fusion layer.

2. The semiconductor laser of claim 1, wherein the fusion layer comprises more than one material.

3. The semiconductor laser of claim 1, wherein the fusion layer comprises more than one layer of material.

4. The semiconductor laser of claim 3, wherein a sublayer of the fusion layer is selected from a group comprising chromium, platinum, titanium, aluminum, nickel, tantalum, molybdenum, zinc, tin, and gold.

5. The semiconductor laser of claim 1, wherein the substrate is selected from a group comprising InP, GaAs, and silicon.

6. The semiconductor laser of claim 1, wherein a thermal resistance of the fusion layer is lower than a thermal resistance of the substrate.

7. A semiconductor laser, comprising:
a substrate;
a fusion layer coupled to the substrate; and
a laser structure, coupled to the fusion layer, wherein the laser structure comprises:
  a first contact layer coupled to the fusion layer;
  a first cladding layer coupled to the first contact layer;
  an active layer coupled to the first cladding layer;
  a second cladding layer coupled to the active layer;
  a second contact layer coupled to the second cladding layer;
  a metallization layer selectively coupled to the second contact layer and the fusion layer; and
  a masking layer coupled to the metallization layer, the second contact layer, the second cladding layer, and the active layer.

8. The semiconductor laser of claim 7, wherein the active layer is a material selected from a group comprising: indium gallium arsenide phosphide, $Al_xGa_{1-x}As$, $Ga_xIn_{1-x}As$, $Ga_xIn_{1-x}P$, and $Ga_xIn_yAl_{1-x}As_{1-y}$, where x and y are from zero to one inclusive.

9. The semiconductor laser of claim 7, wherein the first cladding layer is selected from a group comprising InP, InGaAsP, GaAs, and GaAlAs.

10. The semiconductor laser of claim 7, wherein the first contact layer is selected from a group comprising InP, InGaAsP, GaAs, and GaAlAs.

11. The semiconductor laser of claim 7, wherein the masking layer is selected from a group comprising polyimide, photoresist, and dielectric material.

12. The semiconductor laser of claim 7, wherein the second cladding layer is selected from a group comprising InP, AlGaAs, and GaInAsP.

13. The semiconductor laser of claim 7, wherein the second contact layer is selected from a group comprising InGaAs, InP, GaAlAs, and InGaAs.

14. The semiconductor laser of claim 7, wherein the metallization layer is a mixture of chromium and gold.

15. A semiconductor laser, comprising:
a substrate;
a fusion layer coupled to the substrate, the fusion layer having a thermal resistance and an ohmic resistance less than a thermal resistance and an ohmic resistance of the substrate; and
a laser structure, coupled to the fusion layer, wherein the laser structure comprises:
  a first contact layer coupled to the fusion layer;
  a first cladding layer coupled to the first contact layer;
  an active layer coupled to the first cladding layer;
  a second cladding layer coupled to the active layer;
  a second contact layer coupled to the second cladding layer;
  a metallization layer selectively coupled to the second contact layer and the fusion layer; and
  a masking layer coupled to the metallization layer, the second contact layer, the second cladding layer, and the active layer.

* * * * *